WITNESSES
Theodore T. Wrobel
James F. Young

INVENTOR
Ian M. Mackintosh
BY Gordon H. Telfer
ATTORNEY

United States Patent Office 3,391,035

Patented July 2, 1968

3,391,035

METHOD OF MAKING P-N JUNCTION DEVICES BY DIFFUSION

Ian M. Mackintosh, Anstruther, Scotland, assignor to Westinghouse Electric Corporation, Pittsburgh, Pa., a corporation of Pennsylvania Filed Aug. 20, 1965, Ser. No. 481,214
6 Claims. (Cl. 148—187)

ABSTRACT OF THE DISCLOSURE

This invention relates to a method of forming complementary transistors which are spaced apart in the same body of semiconductor material. The method includes the simultaneous diffusion of P- and N-type dopants into the body.

This invention relates to the production of complementary PNP and NPN transistors having the same operating characteristics, and more particularly to the production of complementary transistors on a single semiconductor wafer.

As is known, attempts have been made to produce satisfactory complementary NPN and PNP transistors in integrated form (i.e., on a single seminconductor wafer). In any integrated circuit, it is necessary to start with a wafer of semiconductor material of one conductivity type. For example, the starting material may be a wafer of P-type silicon. In order to form an NPN transistor in such a wafer, it is necessary only to diffuse into the wafer three regions of successively decreasing depths and areas, the first region being N-type, the second P-type and the third or smallest region N-type. the procedure used in accordance with prior art techniques for forming a PNP transistor in the same P-type silicon wafer is the same, except that a fourth P-type region must be diffused into the previously formed N-type region.

The major difficulty with the foregoing method for forming PNP and NPN transistors on the same wafer is that the characteristics of the two types cannot both be optimized. While many parameters such as saturation voltage and base resistance must be taken into account in the design of transistors optimized for any given application, as a general rule it can be said that maximum frequency response will be obtained in both types of transistors only if the distribution of impurities in their bases is the same. This, however, is impossible with the prior art approaches. If the diffusions rave been tailored to provide an NPN transistor of optimum performance in the example given above, the overdoping required to produce the final P-type region in the PNP transistor will result in a very low emitter breakdown voltage in this latter transistor. The base doping for the PNP transistor will also be far too high to achieve optimum electrical performance. Conversely, if the diffusion and/or alloying steps have been tailored to provide optimum PNP performance, then the NPN structure will be adversely affected.

The prior art approach, described above, is thus generally limited to integrated complementary transistor circuits of marginal performance; and it is axiomatic that mutually high performance of both types of transistors cannot be achieved by this approach.

As an overall object, the present invention seeks to provide a new and improved process for forming integrated, truly complementary transistors having the same operating characteristics.

Another object of the invention is to provide a method for the production of complementary transistors on a single wafer of semiconductor material, which method leads to a truly integrated complementary transistor circuit in which independent optimization of both types of transistors on the same wafer is possible.

A further object of the invention is to provide a technique for diffusing both P and N regions simultaneously at spaced points on a single semiconductor wafer to give essentially the same impurity profiles, whereby the simultaneous diffusing of successive P and N regions on the semiconductor wafer will result in integrated, complementary transistors.

Still another object of the invention is to provide a single semiconductor wafer having complementary NPN and PNP transistors formed therein, wherein the impurity profiles of the two transistors are the same.

The above and other objects and features of the invention will become apparent from the following detailed description taken in connection with the accompanying drawings which form a part of this specification, and in which.

Figure 1:
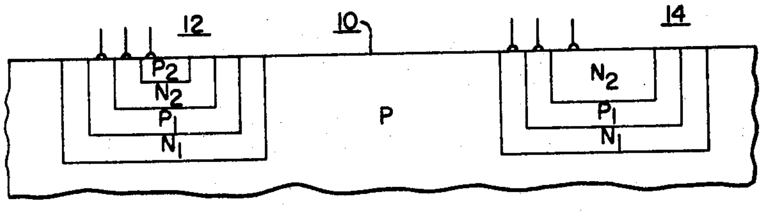
FIG. 1. PRIOR ART
FIGURE 1 illustrates the prior art method for attempting to achieve complementary NPN and PNP transistors on a single semiconductor wafer.
Figure 2:
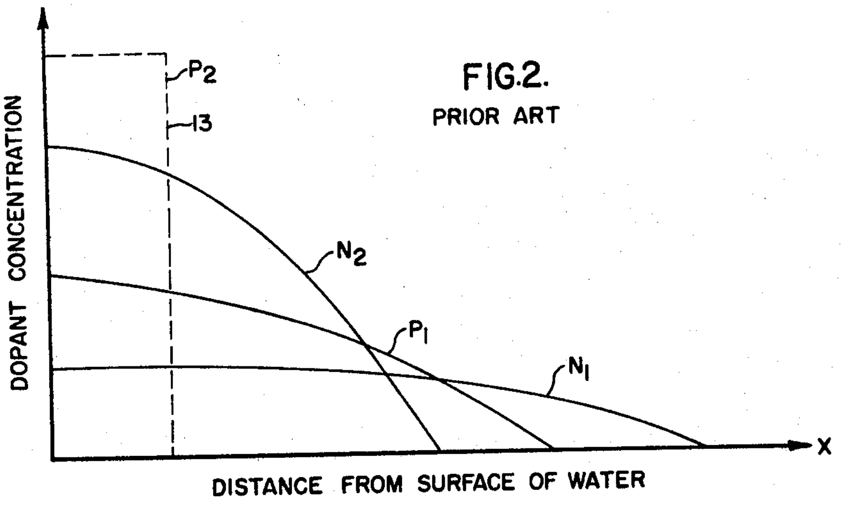
FIG. 2. PRIOR ART
FIG. 2 is a graph illustrating the impurity profiles for the integrated transistors shown in FIG. 1.

With reference now to the drawings, and particularly to FIGS. 1 and 2, a prior art method for attempting to produce integrated complementary transistors is shown. These illustrations are believed to be necessary for a full and complete understanding of the present invention.

Thus, as shown in FIG. 1, a layer of P-type silicon 10, for example, has formed therein two complementary PNP and NPN transistors 12 and 14, respectively. Both transistors 12 and 14 are formed by initially diffusing $N_1$ regions in the P-type silicon wafer 10. Following simultaneous diffusion of the $N_1$ regions, $P_1$ regions are diffused into the previously formed N-type regions, followed by diffusion of smaller $N_2$ regions. At this point, both of the transistors are of the NPN type. In order to form the PNP transistor 12, a fourth $P_2$ region must be formed in the previously diffused $N_2$ region of transistor 12. This, however, unbalances the characteristics of the two transistors 12 and 14 as is perhaps best shown in FIG. 2 which is a plot of the distance $x$ from the top of the wafer 10 versus concentration of the dopant. Thus, the original $N_1$ diffusion in both transistors extends rather deeply down into the wafer 10 and is of relatively low concentration. The $P_1$ region does not extend as far down into the wafer 10, but is of greater concentration, particularly at the upper surface of the wafer; and the $N_2$ diffusion is even shallower but of greater concentration.

It is apparent from FIG. 2 that the $N_1$, $P_1$ and $N_2$ regions are all of the same concentration; it is only the $P_2$ region which distinguishes the two structures. This additional $P_2$ region is shown by the dotted line 13, and is assumed to be a heavily-doped alloy region. However, a shallow, heavily-doped P-type diffusion could also be assumed. In any event, the $N_1$–$P_1$–$N_2$ transistor 14 will not have the same operating characteristics as the $P_1$–$N_2$–$P_2$ transistor 12. Thus, as was mentioned above, it is axiomatic that mutually high performance of both transistors cannot be achieved by the approach shown in FIGS. 1 and 2.

With reference now to FIGS. 3–7, one embodiment of the present invention is shown which is based upon a combination of conventional vapor-phase diffusions with diffusion from a doped oxide. Such doped oxides can be produced, for example, by anodization in an electrolyte containing the appropriate diffusion element, by glow discharge techniques, and in other ways.

Figure 3:
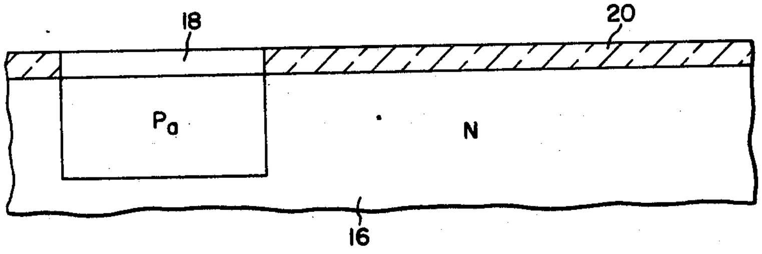
FIGS. 3–7 illustrate steps of one embodiment of the present invention wherein simultaneous diffusion of P-type and N-type dopant elements are from a doped oxide and the vapor state, respectively.

The process starts as shown in FIG. 3 wherein the starting material is a wafer of N-type silicon 16. The upper surface of the wafer is initially lapped and prepared by electropolishing and etching, if necessary. Thereafter, the area 18 on the upper surface of wafer 16 is masked in accordance with conventional photo-resist techniques. As is known, this technique involves covering the entire wafer 16 with a photo-resist solution comprising a material with polymerizes when subjected to ultraviolet light. The material is allowed to dry and is then exposed to ultraviolet light at the area which is intended to be covered by the mask, in this case area 18. The photo-resist layer on the upper surface of the wafer 16 is then developed, during which process all but area 18 is washed away, thereby exposing the surface of the wafer 16 beneath.

After the area 18 is thus masked, the wafer 16 may be subjected to anodic oxidation. In this process, the N-type silicon wafer is immersed within an electrolyte and is connected to the positive terminal of a direct current voltage source, while the negative terminal of the same source is connected to an inert electrode of platinum or the like depending downwardly into the electrolyte. The electrolyte preferably comprises a solution of potassium nitrite in tetrahydrofurfuryl alcohol; however any electrolyte may be utilized which will facilitate oxide growth on the surface of the wafer 10, such as ammonium pentaborate in aqueous solution. Upon the application of a potential between the inert electrode and the wafer 16, a pure oxide layer 20 will grow on the surface of the wafer 16, except at area 18 which is now covered by the photo-resist mask. Following the formation of the oxide 20, the mask is removed at area 18, leaving an opening in the oxide layer 20.

Following the formation of the oxide layer 20 and removal of the mask at area 18, the wafer 16 with the oxide layer thereon is subjected to a conventional vapor phase diffusion technique wherein a P-type dopant from a gas such as $B_2O_3$ diffuses into the wafer 16 at the exposed area 18, thereby forming a first lightly doped P-type region $P_a$. Following the diffusion technique, the oxide layer 20 is removed. The next step in the process involves the formation of an N-type (phosphorus) doped oxide layer on the upper surface of wafer 16. This layer is subsequently removed except for a small island 22 shown in FIG. 4 above the previously formed P-type doped region $P_a$. The phosphorus-doped oxide may be formed by immersing the wafer 16, as shown in FIG. 3 but with the oxide layer 20 removed, in an electrolyte comprising a solution of pyrophosphoric or phosphorus acid in tetrahydrofurfuryl alcohol. The wafer 16 is again made the anode within the electrolyte, and upon application of a suitable potential between it and a platinum or the like cathode, a phosphorus-doped oxide will grow over the region $P_a$. This is subsequently removed except for the island 22 as mentioned above.

Figure 4:
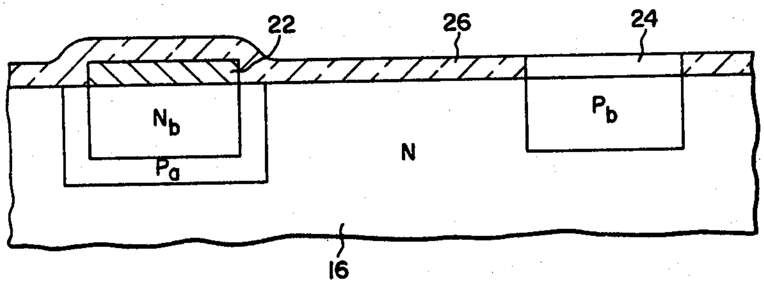

Following the formation of the doped oxide island 22 above the P-type region $P_a$, a mask is applied to area 24 as shown in FIG. 4 by conventional photo-resist techniques, and the entire wafer again subjected to an anodic oxidation process of the type described above wherein a pure oxide layer 26 forms over the entire surface of the wafer 16, and also covers the phosphorus-doped oxide island 22. The photo-resist mask at area 24 is now removed, and the wafer 16 is submitted to heat in the presence of a P-type dopant in the vapor phase. During this procedure, a P-type doped region $P_b$ forms beneath the opening at area 24; and the heat causes the phosphorus in the doped oxide layer 22 to diffuse into the previously-doped P-type region $P_a$ to form an N-type region $N_b$. In this process, the oxide layer 26 acts to prevent out-diffusion of the phosphorus in the doped oxide layer 22.

During the diffusion process, the wafer 16 is heated at a normal diffusion temperature and in an ambient of, for example $B_2O_3$. Since the diffusion coefficients of boron in the vapor state and phosphorus in the doped oxide layer 22 are essentially equal, and since the oxide layer 22 will mask the boron diffusion everywhere but at the unoxidized area 24, there now occurs simultaneous, localized diffusion of both boron and phosphorus. Thus, at this stage, illustrated in FIG. 4, almost identical, localized diffusions $N_b$ and $P_b$ of phosphorus and boron, respectively, are formed which are separated on the wafer 16.

Following the simultaneous diffusion of the regions $N_b$ and $P_b$, the oxide layer 26 as well as the doped oxide island 22 are etched away; and a second phosphorus-doped oxide island 30 is formed over the previously-doped region $P_b$, but of smaller area than region $P_b$. Again, the wafer 16 is subjected to an anodic oxidation process following the formation of the island 30 such that a pure oxide layer 32 is formed over the entire surface of the wafer 16, except that area 34 which is directly above the previously-doped region $N_b$. Here, again, the area 34 is smaller than the area of region $N_b$ and may be formed by conventional photo-resist masking techniques or by covering the entire wafer with the oxide layer 32, followed by etching away area 34 to expose the previously-formed region $N_b$.

Figure 5:
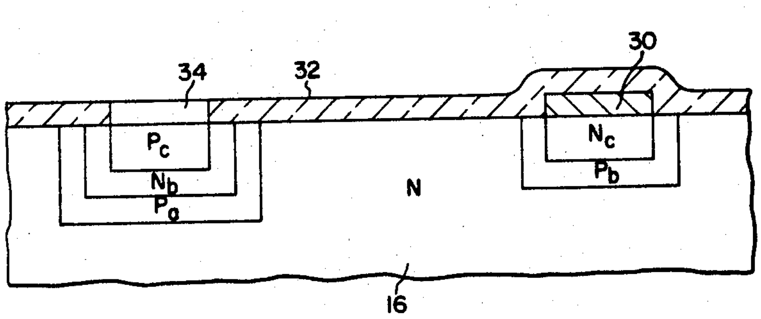

The entire wafer with the doped oxide island 30 and the pure oxide layer 32 thereon is now subjected to vapor diffusion techniques wherein boron, for example, is diffused through opening 34 to form a P-type doped region $P_c$ in the previously-doped N-type region $N_b$. At the same time, an N-type doped region $N_c$ is formed beneath the doped oxide island 30. This is shown in FIG. 5.

Figure 6:
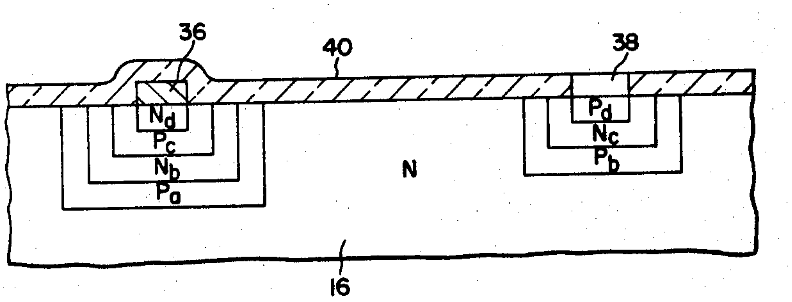

The final step is shown in FIG. 6 and comprises a repetition of the foregoing process with a phosphorus-doped oxide island 36 being formed over the previously-doped region $P_c$ and an opening 38 formed in an oxide layer 40 over the previously-doped region $N_c$, but of smaller area than region $N_c$. By again subjecting the wafer to vapor diffusion techniques, boron will be diffused through opening 38 to form a P-type doped region $P_d$; while the phosphorus in island 36 will diffuse into the previously-formed region $P_c$ to form region $N_d$.

Figure 7:
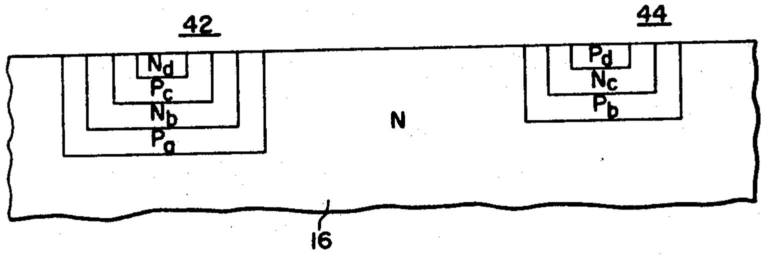

The final structure is shown in FIG. 7 wherein two complementary NPN and PNP transistors 42 and 44, respectively, are formed in the same N-type silicon wafer 16. In the case of transistor 42, region $N_b$ would form the emitter, region $U_c$ the base, and region $N_d$ the collector. Similarly, in the case of transistor 44, region $P_b$ forms the emitter, region $N_c$ the base, and region $P_d$ the collector. As will be understood, there are many applications of complementary-transistor circuits in which the $P_a$ isolation region will not be necessary. The final structure in this case will then consist of regions $N_b$–$P_c$–$N_d$ and $N_c$–$P_d$, the N-type wafer itself acting as the collector region of the NPN device which would now be in the place of PNP transistor 44 shown in FIG. 7. The more complicated structure illustrated herein, however, is for the sake of completeness.

The foregoing discussion has been principally directed to the case where simultaneous diffusions on the same semiconductor wafer are carried out from a doped oxide and a dopant in the vapor state, respectively. It is, however, possible to carry out simultaneous diffusions from two oppositely-doped oxide layers.

Figure 8:
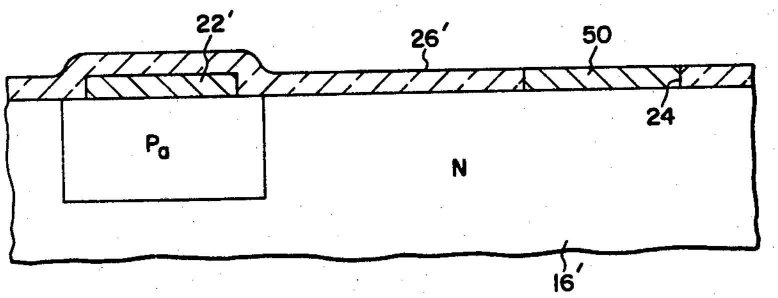
FIGS. 8 and 9 illustrate steps of another embodiment of the invention wherein the simultaneous diffusions are from oppositely doped oxide islands on a semiconductor wafer.
Figure 9:
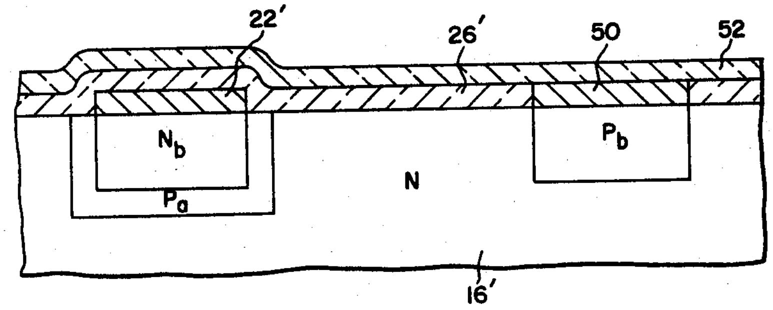

This is shown, for example, in FIGS. 8 and 9. In FIG. 8, the structure is essentially the same as that shown in FIG. 4, but before the N-type wafer 16 has been heated to form the regions $N_b$ and $P_b$ by diffusion. In this case, the opening 24, instead of exposing the surface of the wafer 16, is filled with a P-type anodic oxide layer 50. The layer 50, for example, may be formed in accordance with the teachings of copending application Ser. No. 431,907, filed Feb. 11, 1965, and assigned to the assignee of the present application. It will be remembered that the N-type doped oxide layer 22 shown in FIG. 4 was formed by immersing the wafer 16 in an electrolyte comprising a solution of pyrophosphoric or phosphorus acid in tetrahydrofurfuryl alcohol. When the wafer 16 is made the anode within the electrolyte, and upon application of a suitable potential between it and a platinum or the like cathode, also in the electrolyte, a phosphorus-doped oxide will grow on the upper surface of the wafer. This is subsequently removed except for the island 22, corresponding to island 22' shown in FIG. 8.

While an N-type anodic oxide layer will grow on the surface of P-type silicon (i.e. region $P_a$, for example), growth of anodic oxide films on N-type silicon depends upon the availability of minority carriers (i.e., holes) at the surface of the wafer. No oxide growth will occur in complete darkness below the breakdown strength of the silicon-electrolyte surface of the barrier provided the surface recombination-regeneration velocity is low. Oxide growth can, therefore, be controlled by illumination with light of wavelength shorter than the absorption edge.

Thus, growth of the P-type oxide layer 20 can be controlled by a source of external illumination, not shown, such that it covers only that area exposed by opening 24. In order to form the P-type oxide layer 50, the wafer 16' with the N-type oxide 22' and pure oxide layer 26' already formed thereon, is immersed in an electrolyte which may, for example, comprise polyhedral borane in tetrahydrofurfuryl alcohol. Upon application of a suitable potential between the wafer 16' and an inert electrode within the electrolyte, anodic oxide growth will occur in the area of opening 24 provided that light from a source, not shown, is directed through a lens system only onto the area of the opening 24. Of course, an alternative method may be employed wherein a mask is applied over the entire area of the pure oxide layer 26', except opening 24, and the entire wafer then illuminated during the growth of the P-type oxide.

Following formation of the anodic P-type oxide 50, the first oxide layer 26' is covered with a second oxide layer 52, preferably by the anodic oxide growth technique described above. Thus, the N-type oxide island 22' is now covered by both oxide layers 26' and 52; whereas the P-type oxide island 50 is covered by pure oxide layer 52 only. The oxide layers 26' and 52 are necessary, or at least desirable, in order to prevent out-diffusion of the dopant element from the oxide layers 22' and 50 during heating of the wafer. In certain cases, however, it may be possible to eliminate one or both of the oxide layers, depending upon requirements.

Upon heating of the assembly shown in FIG. 9, the regions $N_b$ and $P_b$ will form in somewhat the same manner as described above with reference to FIG. 4. In order to form the completed integrated transistor structure, the positions of the N-type and P-type oxide layers are reversed alternately to more or less duplicate the steps shown in FIGS. 5, 6 and 7 for the case where the P-type dopant is diffused from the vapor state.

It can thus be seen that a complementary transistor integrated circuit can be fabricated in which the N-type and P-type impurity profiles have been essentially interchanged in the two devices. Within the limitations of the difference between the diffusion coefficients for phosphorus and boron, simultaneous optimization of the characteristics of the NPN and PNP devices may be obtained. Thus, the invention provides a method for producing integrated complementary transistor circuits in which reduced power dissipation, high speed performance and extended range of electrical behavior in applications can be achieved.

While the invention has been described in connection with certain specific examples, it will be apparent that various changes can be made without departing from the basic concept of simultaneous diffusion of P-type and N-type regions. Thus, other P-type and N-type diffusions can be used such as P-type diffusion from a doped oxide and N-type diffusion from the vapor state; and the starting material can be P-type rather than the N-type wafer 16 shown herein for purposes of illustration. It will also be apparent that other structures such as complementary diodes and PNP–NPN structures may be fabricated by the basic technique of the invention.

I claim as my invention:

1. In the process for forming P-N junction devices at spaced areas on a single semiconductor wafer, the steps of heating the wafer, and simultaneously diffusing dopant elements of opposite conductivity types into the wafer at said spaced areas on the wafer, one of said dopant elements being diffused into the wafer from a doped insulating layer on the surface of the wafer and the other of said dopant elements being diffused into the wafer from the vapor phase.

2. The process of claim 2 wherein the said insulating layer is an oxide layer, an N-type dopant element is diffused into the wafer from said oxide layer and a P-type dopant element is diffused into the wafer from the vapor phase.

3. In the process for forming complementary transistor devices at spaced areas on a semiconductor wafer, the steps of forming a doped oxide layer covering one of said areas only, the dopant element in said doped oxide layer being of one conductivity type, forming a pure oxide layer over the entire surface of said wafer including the previously-formed doped oxide layer but excluding the other of said spaced areas which remains exposed, and heating the oxide-coated wafer in an atmosphere containing a dopant element of the other conductivity type in the vapor phase whereby the dopant element of said one conductivity type will diffuse into the wafer at said one area from the doped oxide layer while the dopant element of the other conductivity type will simultaneously diffuse into the wafer through the opening in the pure oxide layer at said other area.

4. In the process for forming complementary transistor devices at spaced areas on a semiconductor wafer, the steps of forming a doped oxide layer covering one of said areas only, the dopant element in said doped oxide layer being N-type, forming a pure oxide layer over the entire surface of said wafer including the previously-formed N-type doped oxide layer but excluding the other of said spaced areas which remains exposed, and heating the oxide-coated wafer in an atmosphere containing a P-type dopant element in the vapor phase whereby the N-type dopant element will diffuse into the wafer at said one area from the doped oxide layer while the P-type dopant element will diffuse into the wafer through the opening in the pure oxide layer at said other area from the vapor phase.

5. In the process for producing complementary PNP and NPN transistors at first and second spaced locations on a single semiconductor wafer of one conductivity type, the steps of forming a single first region of the other conductivity type in the wafer at said one location, forming a smaller diffused region of said one conductivity type in the previously-formed single region at said one location while simultaneously forming a second independent region of said other conductivity type in the wafer at said second location, thereafter simultaneously forming regions of said other and said one conductivity type at said first and second locations respectively with the regions thus formed being smaller in area and depth than the previously-formed regions, and finally simultaneously forming regions of said one and said other conductivity type at said first and second locations respectively.

6. In the process for producing complementary PNP and NPN transistors at first and second spaced locations on a single N-type semiconductor wafer, the steps of forming a single P-type region in the wafer at said one location, forming a smaller diffused N-type region in the previously-formed single P-type region at said one location while simultaneously forming a second independent P-type region in the wafer at said second location, thereafter simultaneously forming P-type and N-type regions at said first and second locations respectively with the regions thus formed being smaller in area and depth than the previously-formed regions, and finally simultaneously forming N-type and P-type regions at said first and second locations respectively, whereby complementary NPN and PNP transistors will be formed at said first and second locations.

References Cited

UNITED STATES PATENTS

| | | | |
|---|---|---|---|
| 3,144,366 | 8/1964 | Rideout. | |
| 3,145,126 | 8/1964 | Hardy | 148—187 |
| 3,183,128 | 5/1965 | Leistiko | 148—33.5 XR |
| 3,200,019 | 8/1965 | Scott. | |
| 3,281,291 | 10/1966 | Greenberg | 148—188 XR |
| 3,287,187 | 11/1966 | Rosenheirrich | 148—187 |
| 3,288,656 | 11/1966 | Nakamura | 148—33.5 |
| 3,316,131 | 4/1967 | Wisman | 148—186 XR |

HYLAND BIZOT, *Primary Examiner*.